US006295005B1

(12) United States Patent
Ootsuki

(10) Patent No.: US 6,295,005 B1
(45) Date of Patent: Sep. 25, 2001

(54) RADIO SELECTIVE-CALLING RECEIVER WITH DEFERRING FUNCTION INFORMING RECEIVED CONTENTS AND METHOD THEREOF

(75) Inventor: Michihito Ootsuki, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/314,157

(22) Filed: May 19, 1999

(30) Foreign Application Priority Data

May 19, 1998 (JP) ........................................ 10-136757

(51) Int. Cl.[7] ........................................ H05K 7/14

(52) U.S. Cl. ........................ 340/825; 340/7.34; 455/140; 455/150.1

(58) Field of Search ........................ 455/31.1, 31.2, 455/32.1, 38.1, 38.2, 38.4, 567, 267, 527, 466, 825, 13.4, 140; 340/825, 870.4, 825.44, 7.21, 7.2, 7.32, 7.34; 370/331, 311; 375/147, 364, 368, 136

(56) References Cited

U.S. PATENT DOCUMENTS

| | | | | |
|---|---|---|---|---|
| 5,371,737 | * | 12/1994 | Nelson et al. | 370/84 |
| 5,774,061 | * | 6/1998 | Kudoh | 340/825.44 |
| 5,930,681 | * | 7/1999 | Snowden et al. | 455/13.4 |
| 5,937,356 | * | 8/1999 | Kudoh | 455/502 |
| 5,959,544 | * | 9/1999 | Matsuura | 340/825.44 |
| 5,960,326 | * | 9/1999 | Kido | 455/31.2 |
| 5,986,567 | * | 11/1999 | Shima | 340/825.44 |
| 6,009,308 | * | 12/1999 | Matsuuura | 455/31.3 |
| 6,011,955 | * | 9/1999 | Tsuchiyama | 455/38.4 |
| 6,104,710 | * | 8/2000 | Miyashita | 370/350 |

FOREIGN PATENT DOCUMENTS

| | | |
|---|---|---|
| 2 281 796 | 3/1995 | (GB) . |
| 60-10824 | 1/1985 | (JP) . |
| 3-29524 | 2/1991 | (JP) . |
| 4-7921 | 1/1992 | (JP) . |
| 4-286429 | 10/1992 | (JP) . |
| 5-63632 | 3/1993 | (JP) . |
| 9-116942 | 5/1997 | (JP) . |
| 9-331566 | 12/1997 | (JP) . |

* cited by examiner

*Primary Examiner*—William Trost
*Assistant Examiner*—Conavan Tran
(74) *Attorney, Agent, or Firm*—Young & Thompson

(57) ABSTRACT

A radio selective-calling receiver that defers indication of receipt of a call for the receiver until after a further frame when the further frame is also for the receiver. A data separating section takes in demodulated signals by sampling. When the receiver's calling number exists in the received data, a controller waits until the next frame that is also an "own" frame, to output display signals or sound signals. Therefore, at the time when the own address is being received, the informing operation can be prevented and the receiving operation can be implemented in a more stable receiving state. As a result, the deterioration of the receiving sensitivity is prevented and the effect that the error of the receiving data is decreased can be obtained.

8 Claims, 6 Drawing Sheets

RADIO SELECTIVE-CALLING RECEIVER WITH DEFERRING FUNCTION INFORMING RECEIVED CONTENTS AND METHOD THEREOF

BACKGROUND OF THE INVENTION

The present invention relates to a radio selective-calling receiver and method that gives priority to the reception of new calls and defers informing the user until the reception of the new call is finished.

DESCRIPTION OF THE RELATED ART

FIG. 1 is a process chart showing a procedure of receiving the information at a conventional radio selective-calling receiver system. Recently, various communication systems have been used for paging systems, this system is an example. The data shown in FIG. 1 are constituted of a data structure part 20, a cycle structure part 21 and a frame structure part 22.

The mentioned above data structure part 20 has fifteen cycles numbered from 0 to 14 and fifteen cycles are one hour. Therefore this one cycle is four minutes. The cycle structure part 21 has 128 frames numbered 0 to 127. Therefore this one frame is 1.875 seconds.

The frame structure part 22 is constituted of a synchronizing signal and eleven blocks numbered 0 to 10. And data of one frame is divided to eight parts corresponding to the contents of the data. These eight parts are a synchronizing part 22A, a frame information part 22B, a synchronizing part 22C, a block information part 22D, an address field 22E, a vector field 22F, a message field 22G and an idle block 22H.

The synchronizing part 22A is standard information that stipulates the frame type, that is, a modulation system and a transmission rate. The frame information part 22B is the information that stipulates the frame number in the frame structure part 22, the cycle number in the data structure part 20 and so forth. The synchronizing part 22C is timing information of the frame type stipulated at the above mentioned synchronizing part 22A. The block information part 22D, the address field 22E, the vector field 22F, the message field 22G and the idle block 22H are frame information transmitting by the frame type stipulated at the synchronizing part 22A.

The block information part 22D is a block which stores the starting point of the address field 22E, the start point of the vector field 22F, a system variable receiving cycle value which a receiver stipulates a frame to be received and so forth. The address field 22E is a field that stipulates an address code being a calling number of a radio selective-calling receiver.

The vector field 22F is a field that stipulates message information regarding the mentioned above address code. The message field 22G is a field that stores message data corresponding to the contents stipulated at the vector field 22F. The idle block 22H is a block not used and stores a pattern being a series of 1 and 0.

The low power consumption is required, therefore the receiver at the mentioned above system implements intermittent receiving operation. This intermittent receiving operation is implemented by the variable receiving cycle value obtained from the block information part 22D. Only at the frame in which the own calling number exists (hereinafter referred to as own frame), the receiving section is operated. Therefore, at the time when the own calling number is received at the own frame, the message corresponding to the calling number is received in sequence and the informing operation to the receiver is implemented.

The Japanese Patent Application Laid-Open No. HEI 4-286429 discloses a radio selective-calling receiver which implements informing operation at predetermined time, even receives many messages, and can also give priority from which message a user takes out. This receiver provides a memory and a timer, the messages are stored in the memory and are outputted at the predetermined time set by a built-in timer.

The Japanese Patent Application Laid-Open No. HEI 9-116942 discloses a radio selective-calling receiver which provides a memory and a timer. This receiver has almost the same functions as mentioned above and first memorizes the information and informs the user the received information at the predetermined time set by the user.

The Japanese Patent Application Laid-open No. HEI 9-331566 discloses a radio selective-calling receiver which implements informing operation after finishing setting an added function such as registering telephone numbers. This receiver provides a photoelectric switch which detects the open/close state of a lid of the receiver and a memory. At the time of setting an added function, the lid is opened and this open state of the lid is detected by the photoelectric switch. At the case that a message is received during the setting, the message is memorized in the memory. After finishing the setting, the lid is closed and the signal detected from the photoelectric switch is outputted and the message is informed to the informing means by the control of the controller.

However, the conventional radio selective-calling receiver has restriction on its circuit physically and operationally, under the request of small sized and low power consumption. Therefore, there is a problem that the own operation of the receiver such as the informing operation of the received contents to the informing means influences the receiver itself and causes the deterioration of the receiving sensitivity.

Moreover, plural circuits operate at the receiving operation with the same time operation of informing operation of the received contents inside the receiver. And then the current consumption increases, therefore there is a problem that the burden loaded to the DC/DC converter being the power supply of the receiver is increased.

SUMMARY OF THE INVENTION

It is therefore an object of the present invention to provide a radio selective-calling receiver with deferring function informing the received contents and a method thereof which in particular decreases the bad influence for receiving operation.

According to a first aspect of the present invention, for achieving the above mentioned objects, a radio selective-calling receiver with deferring function informing the received contents at a paging system in which calling numbers are divided into some groups and calling contents are transmitted in some time unit, provides an informing means for informing the received calling, and a judging means for judging whether the informing operation is deferred or not, and implements said judgement by based on either that own calling number is transmitted just before the informing operation or that said own calling number is transmitted by successive frames.

According to a second aspect of the present invention, in the first aspect, said deferring operation of the received contents is that the informing operation is not implemented soon after said frame is received and is temporarily stopped, and after said next frame is received, said stopped operation is cancelled and the informing operation is implemented.

According to a third aspect of the present invention, a radio selective-calling receiver with deferring function informing the received contents, provides a data separating means for outputting the received data corresponding to the predetermined sampling clock, an address checking means for checking whether the own address number exists in said received data outputted from said data separating means or not, a received frame judging means for judging whether the next frame to be checked at said address checking means is the own frame transmitted own address or not, and a controller for controlling the operation of each means, and controls the power supply based on the judgement by said received frame judging means.

According to a fourth aspect of the present invention, in the third aspect, a radio selective-calling receiver with deferring function informing the received contents, provides a receiving means which amplifies and modulates the received signals from the designated communication base station and outputs the demodulated signals.

According to a fifth aspect of the present invention, in the first aspect, said informing means informs the designated information to a user, based on said received frame judging means and at the time when the own calling number exists in said received data.

According to a sixth aspect of the present invention, a radio selective-calling receiving method with deferring function informing the received contents at a paging system in which calling numbers are divided into some groups and calling contents are transmitted in some time unit, provides an informing process for informing the received calling, and a judging process for judging whether the informing operation is deferred or not, and implements said judgement by based on either that own calling number is transmitted just before the informing operation or that said own calling number is transmitted by successive frames.

According to a seventh aspect of the present invention, in the sixth aspect, said deferring operation of the received contents is that the informing operation is not implemented soon after said frame is received and is temporarily stopped, and after said next frame is received, said stopped operation is cancelled and the informing operation is implemented.

According to an eighth aspect of the present invention, a radio selective-calling receiving method with deferring function informing the received contents, provides a data separating process for outputting the received data corresponding to the predetermined sampling clock, an address checking process for checking whether the own address number exists in said received data outputted from said data separating process or not, a received frame judging process for judging whether the next frame to be checked at said address checking process is the own frame transmitted own address or not, and a controller for controlling the operation of each process, and controls the power supply based on the judgement by said received frame judging process.

According to a ninth aspect of the present invention, in the eighth aspect, a radio selective-calling receiving method with deferring function informing the received contents, provides a receiving process which amplifies and modulates the received signals from the designated communication base station and outputs the demodulated signals.

According to a tenth aspect of the present invention, in the sixth aspect, said informing process informs the designated information to a user, based on said received frame judging process and at the time when the own calling number exists in said received data.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
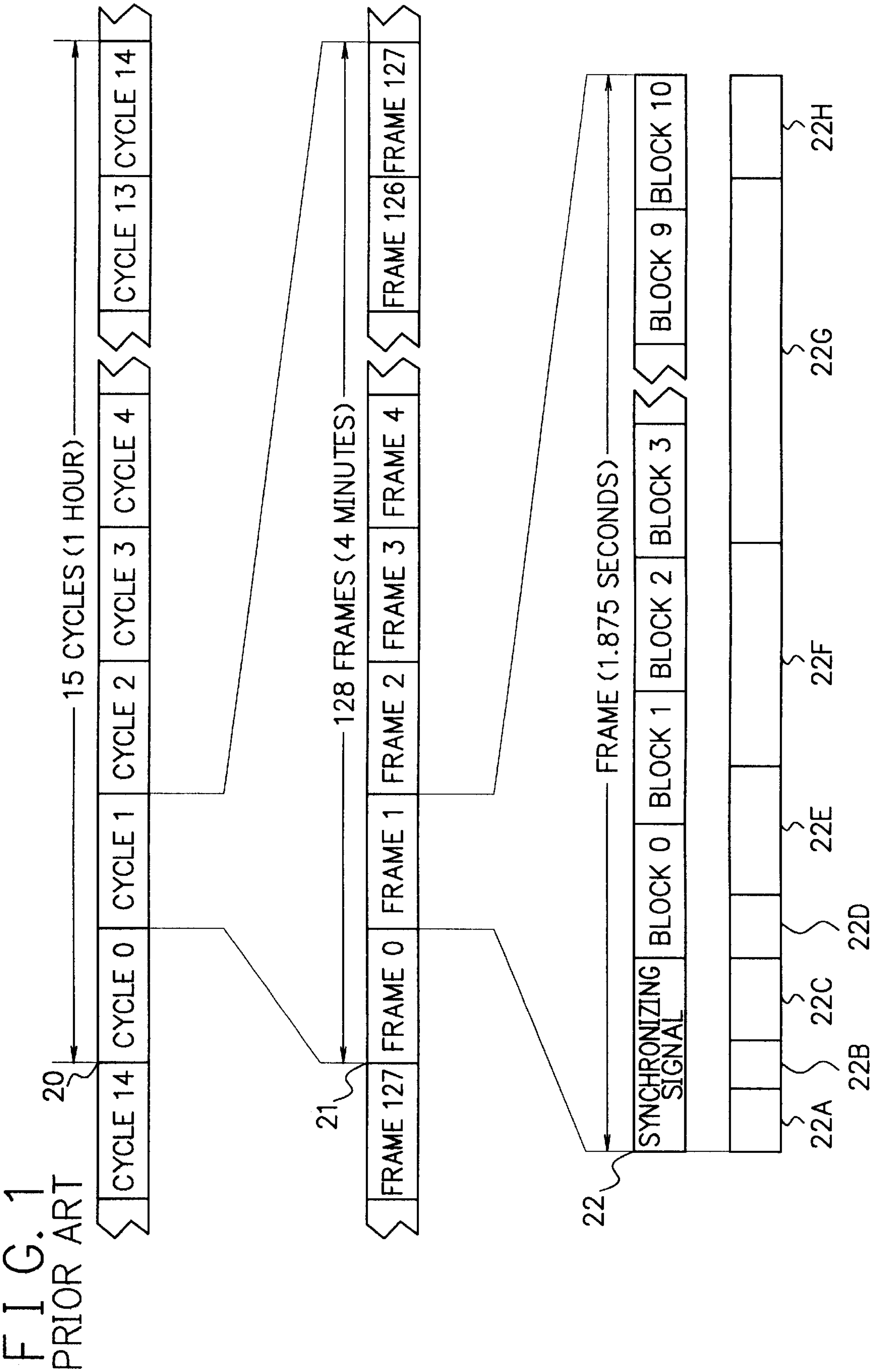
FIG. 1 PRIOR ART
FIG. 1 is a process chart showing a procedure of receiving the information at a conventional radio selective-calling receiver system.

Referring now to the drawings, embodiments of the present invention are explained in detail. Referring to FIGS. 2 to 6, the embodiments of a radio selective-calling receiver with deferring function informing the received contents and a method thereof are explained.

Figure 2:
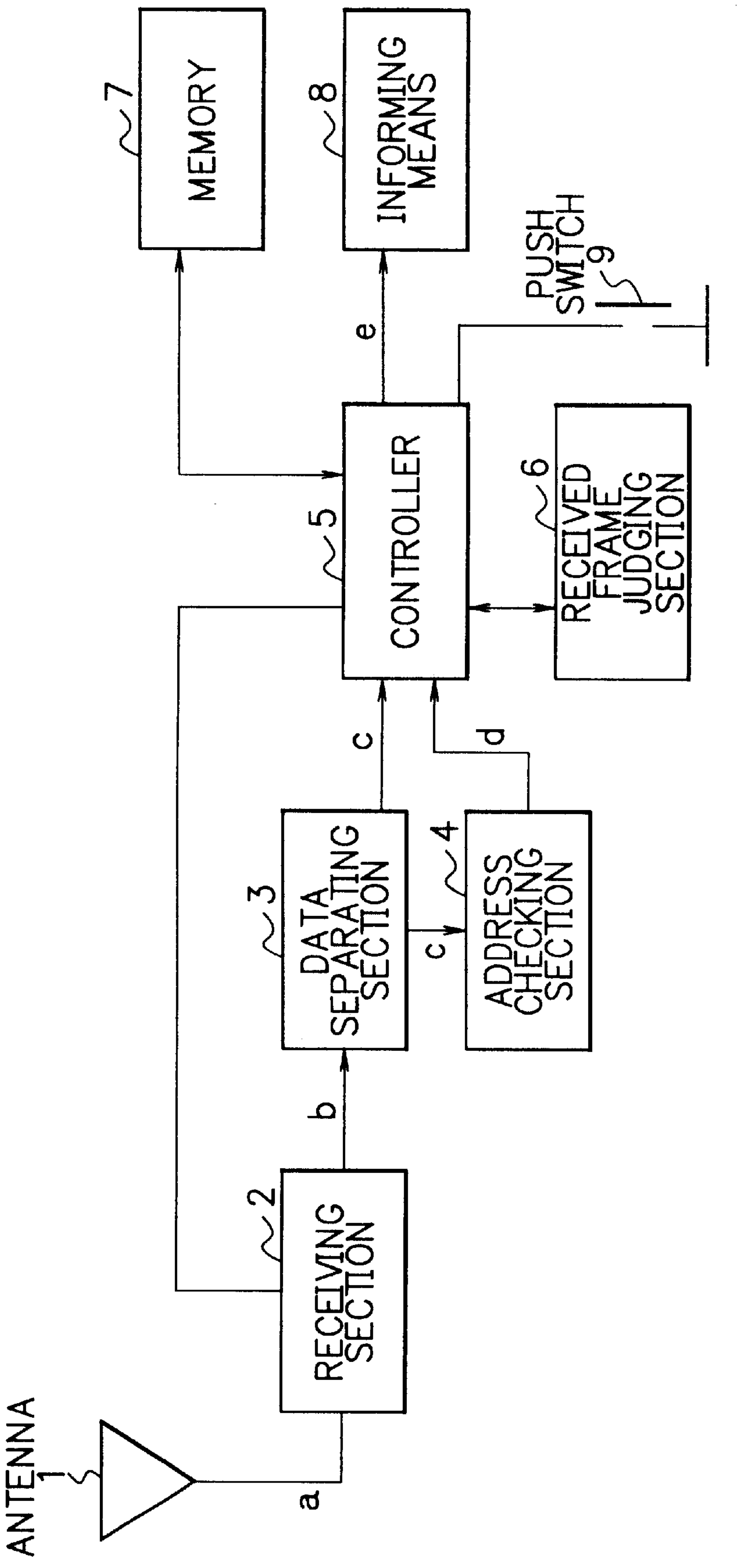
FIG. 2 is a block diagram showing a first embodiment of the present invention.

FIG. 2 is a block diagram showing a first embodiment of the present invention. The radio selective-calling receiver of the present invention is constituted of an antenna 1 which implements radio communication with a base station, a receiving section 2, a data separating section 3, an address checking section 4, a controller 5, a received frame judging section 6, a memory 7 which memorizes the received contents and so forth, an informing means 8 and a push switch 9 by which a user operates.

In FIG. 2, the receiving section 2 which amplifies the signal "a" received at the antenna 1 from the base station and demodulates the signal and outputs the demodulated signal "b". The data separating section 3 which separates the data into an address part and a contents part, and outputs received data "c" by a sampling clock. The address checking section 4 which checks whether there is the own address number or not in received data "c".

The controller 5 controls the operation of each section of the radio selective-calling receiver of the present invention. For example, based on the judgement of the received frame judging section 6, at the time when the own calling signal is detected in the received data "c", the controller 5 controls the power supply for the receiving section 2 in response to the output of the received frame judging section 6 and informs the received contents to the informing means 8.

That is, the received frame judging section 6 judges whether the next frame is the receiver's own frame with the receiver's own address.

Figure 3:
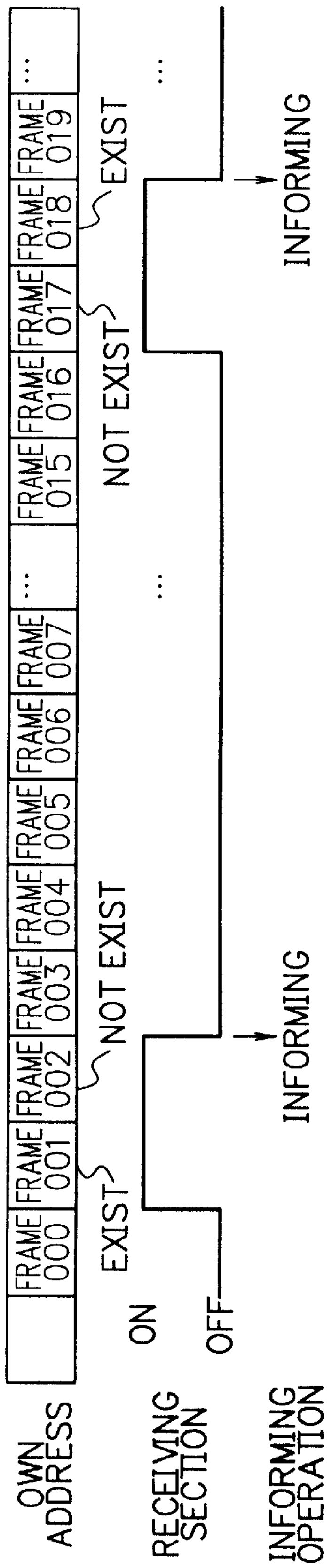
FIG. 3 is a diagram showing the structure of receiving data applying to the first embodiment of the radio selective-calling receiver of the present invention.

FIG. 3 is a diagram showing the structure of receiving data applying to the first embodiment of the radio selective-calling receiver of the present invention. As shown in FIG. 3, the frames by which the own calling number is transmitted are predetermined. Hereinafter, the frame transmitting the receiver's own calling number is referred to as the own frame. In the first embodiment of the present invention, as shown in FIG. 3, the frames 1, 2 and 17, 18 are predetermined as the own frames. Based on these own frames, the receiving section 2 is operated and implements intermittent operation. The receiving operation is implemented at the own frames. Considering the influence to the receiving sensitivity at the time when the own frames continue when the own calling number is detected at the first frame, the informing operation of the received contents to the informing means 8 is not implemented soon after passing through the first frame; that is, the informing operation is deferred. After this deferring, the next frame is received. After received the next frame, this deferring is canceled and the informing operation to the informing means 8 is implemented.

Next, an operation example of the first embodiment of the present invention is explained. First, the antenna 1 receives the radio signal from a radio base station. The receiving section 2 amplifies and modulates the received radio signal "a" at the antenna 1 and outputs the demodulated signal "b".

After this, the data separating section 3 implements the sampling of the demodulated signal "b" and outputs the received data "c" to the controller 5 and the address checking section 4, when the own calling number exists in the received data as determined by checking with the outputted signal "d" from the address checking section 4, the controller 5 waits until the next frame is not the own frame corresponding to the output of the received frame judging section 6. Then, the controller 5 outputs a display signal and a sound signal and so forth "e" to the informing means 8.

The informing means 8 informs the user of receipt of the calling by the display or the sound and so forth.

In this, the received frame judging section 6 takes out the frame which has a possibility transmitting the own calling number in the next, by the present cycle value and frame value and variable receiving cycle value obtained from the received data "c". And the received frame judging section 6 judges whether the next frame is the own frame or not and outputs the judged result to the controller 5.

Figure 4:
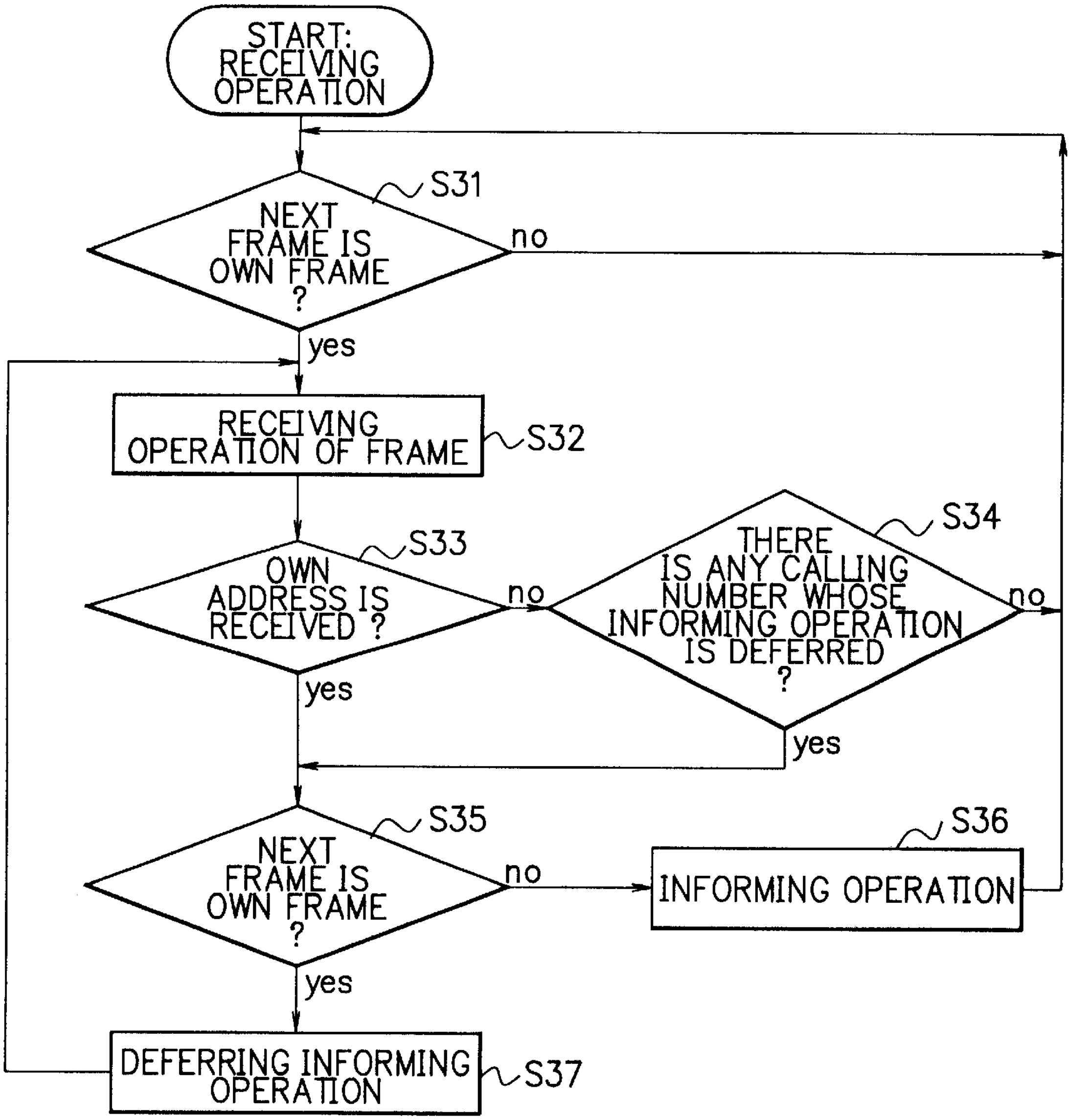
FIG. 4 is a flowchart showing the receiving operation of the own calling number and the informing operation to the user at the synchronizing state.

FIG. 4 is a flowchart showing the receiving operation of the own calling number and the informing operation to the user at the synchronizing state, that is, the state that the synchronizing signal is received and that the receiving of message and the informing of message become possible. Referring to FIG. 4, the operation is explained.

First, the controller 5 judges whether the next frame is the frame to be received or not, by the output from the received frame judging section 6, that is, the frame is whether the next frame is the own frame or not (step S31). And waiting until the frame becomes the frame to be received, at the time when the frame becomes the frame to be received, the data of the frame is received (step S32).

After the receiving operation, at the case that the own address is received (yes at step S33), again the received frame judging is implemented, that is, the frame is whether the next frame is the own frame or not (step S35). At the case that the own address is not received at the own frame (no at step S33), whether any calling number whose informing operation is deferred exists or not is judged (step S34). At the case that the calling number of which informing operation is deferred exists, again the received frame judging is implemented, that is, the frame is whether the next frame is the own frame or not (step S35). At the case that there is no calling number whose informing operation is deferred (no at step S34), the receiving operation is stopped until the next own frame and returns to step S31.

At the case that the calling number to be informed exists (yes at step S34), and at the case that the next frame is the own frame (yes at step S35) by the output of the received frame judging section 6, the receiving operation of the next frame is implemented, and the informing operation is deferred (step S37). At the case that the next frame is not the own frame (no at step S35), the informing operation of the received calling number and the received contents deferred are informed on the informing means 8 (step S36). And the operation waits the next frame (step S31).

As mentioned above, at the first embodiment of the present invention, the informing operation during the time when the own address is receiving can be prevented, by the control of the controller 5 with the outputs from the receiving section 2 which receives the transmitted signal and demodulates the signal and with the output from the received frame judging section 6 which judges whether the next frame is the own frame or not. Therefore, the present invention can implement the receiving operation at the stable receiving state, as a result, the deterioration of the receiving sensitivity is prevented and the effect that the error of the received data is decreased can be obtained. Moreover, the informing operation to the informing means is not implemented during the receiving operation, therefore the effect that the instantaneous increase of the current consumption does not occur can be obtained.

Figure 5:
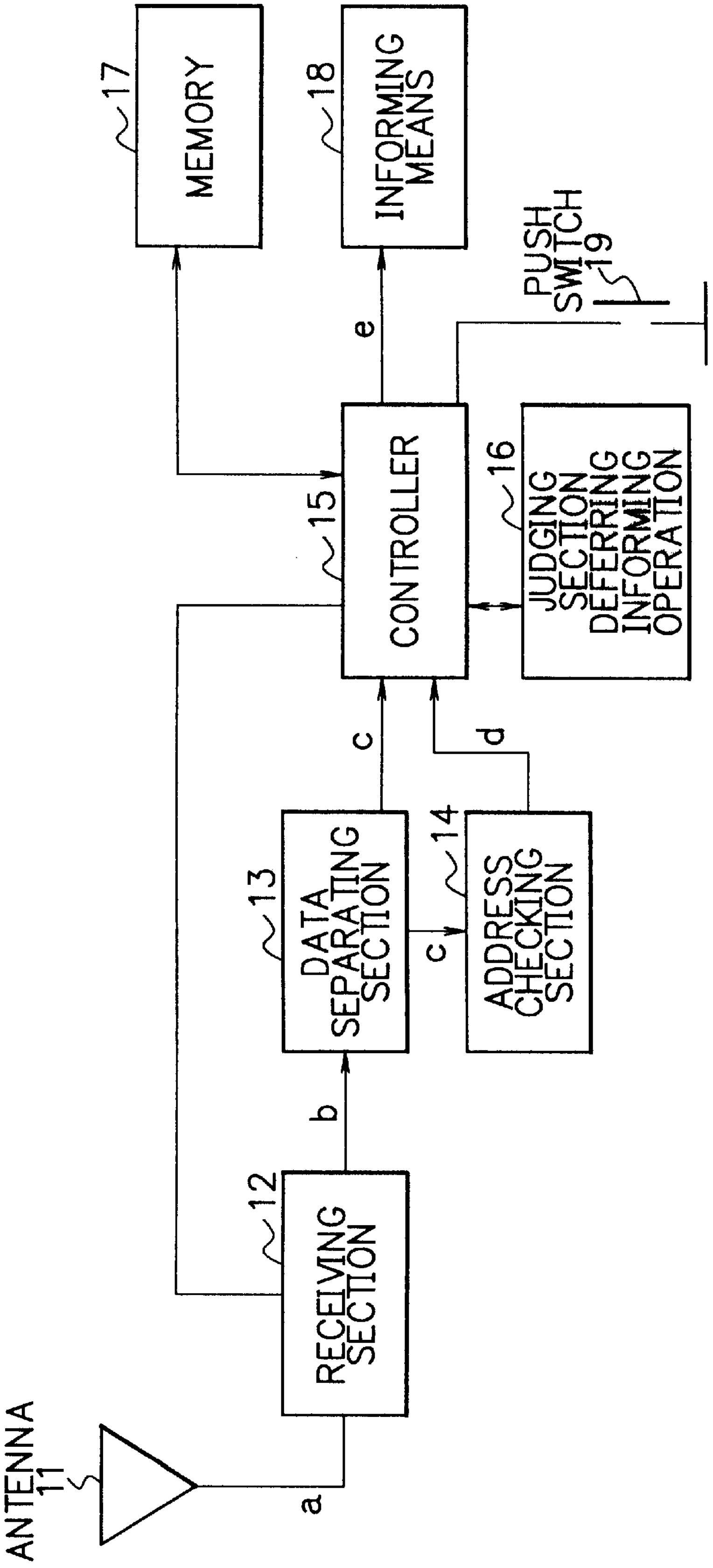
FIG. 5 is a block diagram showing the second embodiment of the radio selective-calling receiver of the present invention.
Figure 6:
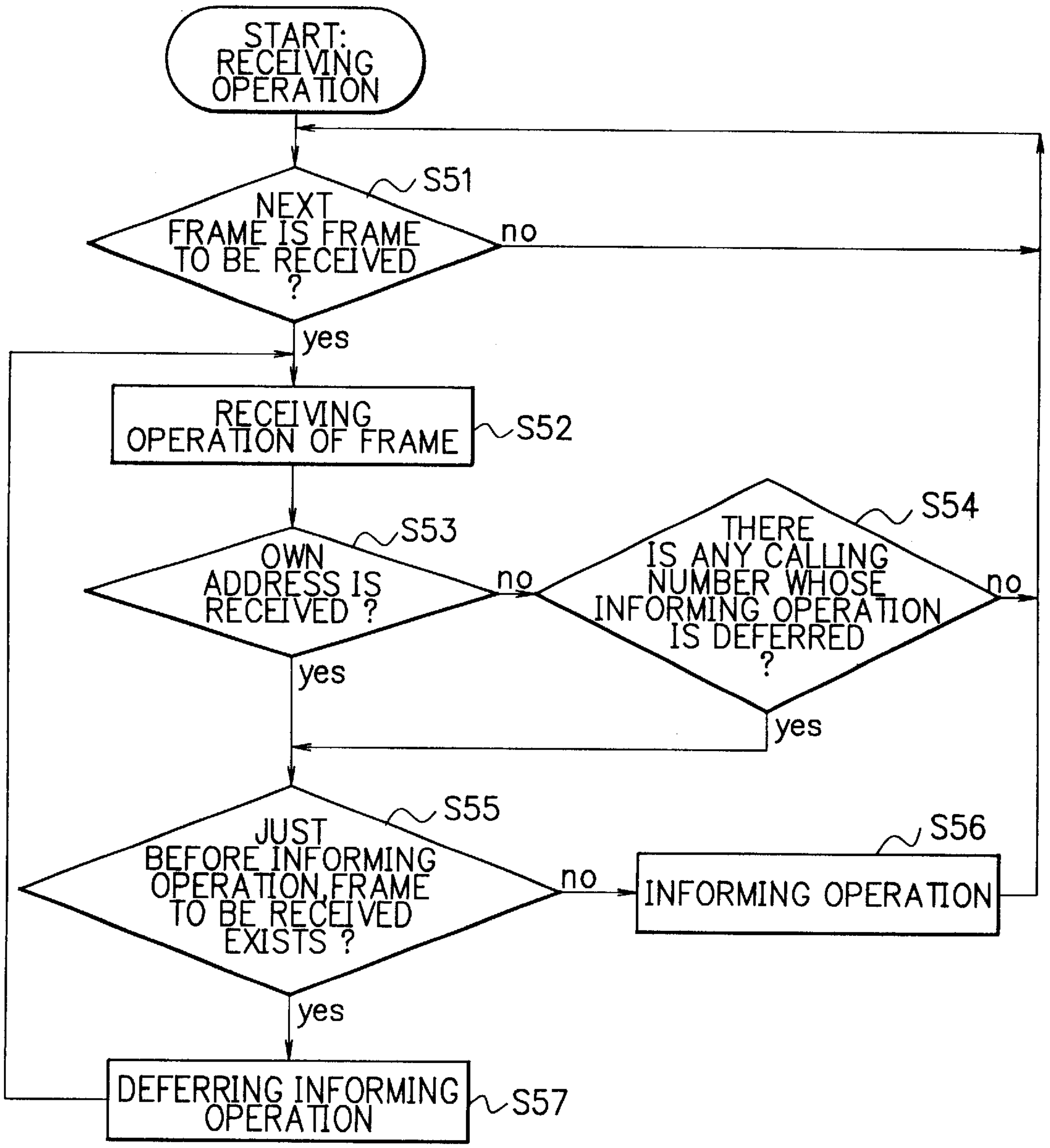
FIG. 6 is a flow chart showing an example of the operation of the second embodiment of the present invention.

Next, a second embodiment of the present invention is explained. FIG. 5 is a block diagram showing the second embodiment of the radio selective-calling receiver of the present invention. FIG. 6 is a flow chart showing an example of the operation of the second embodiment of the present invention.

As shown in FIG. 5, the second embodiment of the radio selective-calling receiver of the present invention is constituted of an antenna 11 which implements radio communication with base station, a receiving section 12, a data separating section 13, an address checking section 14, a controller 15, a judging section deferring informing operation 16, a memory 17 which memorizes the received contents and so forth, an informing means 18 and a push switch 19 by which a user operates. In FIG. 5, the second embodiment has the judging section deferring informing operation 16 instead of the received frame judging section 6 at the first embodiment. The other elements are the same as the first embodiment.

Referring to FIG. 6, the operation of the second embodiment is explained. In the first embodiment, the informing operation is deferred at the time when the next frame is the own frame (step S35 in FIG. 4). However, in the second embodiment, at the time just before when the informing operation starts, at the case that the frame to be received is detected, the frame is received (step S55).

With this, the informing operation is deferred at not only the case that the successive frames are the frames to be received but the case that one frame not to be received is between the frames to be received. At the first embodiment of the present invention, the frames to be received are judged by the own calling number. However, the informing operation can be deferred at the frames to be received by the other information, for example, the time knowing information and so forth. The other operation is almost the same as the first embodiment.

In the second embodiment, at the frames not receiving and at the deferring state of the informing operation, the power is not supplied to the receiving section 12, that is, that the intermittent operation is implemented. However, for this frame, the power supply to the receiving section 12 can be applied.

Above mentioned embodiments are suitable examples applied the present invention. The present invention is not limited to the above mentioned embodiments and is applicable for various application, within the spirit of the present invention.

According to the first aspect of the radio selective-calling receiver and the sixth aspect of the radio selective-calling receiving method of the present invention, the present invention receives the calling number and judges whether the informing operation of the received contents is deferred or not. This judgement is implemented by whether the own calling number is transmitted by the successive two frames or not. Therefore, at the time when the own address is received, the informing operation to the informing means is prevented during the time that the own frame is receiving. Accordingly, the receiving operation can be implemented under the stable receiving state. As a result, the deterioration of the receiving sensitivity is prevented and the effect that the error of the receiving data is decreased can be obtained. Moreover, the informing operation to the informing means is not implemented during the receiving operation, therefore the effect that the instantaneous increase of the current consumption does not occur can be obtained.

According to the third aspect of the radio selective-calling receiver and the eighth aspect of the radio selective-calling receiving method of the present invention, the present invention outputs the received data corresponding to the predetermined sampling clock. And whether the own calling number exists or not in this received data is checked, and whether the next frame to be checked is the own frame transmitting own address or not is judged. The power supply to the received frame judging section is controlled by this judgement. Therefore, the power supply at the unnecessary time is restricted and the increase of the current consumption can be restrained.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A radio selective-calling receiver to which a signal is directed that has a series of frames that each contain call information, the receiver receiving frames selected from the series of frames that are directed to the receiver and that are named own frames, the receiver comprising:

informing means for indicating receipt of call information directed to the receiver in one of the own frames; and deferring means for deferring operation of said informing means until after receipt of a frame immediately following the own frame with the call information when the immediately following frame is also one of the own frames.

2. The receiver of claim 1, wherein said deferring means defers operation of said informing means until immediately after receipt of the following frame.

3. The receiver of claim 1, wherein said deferring means comprises address checking means for checking whether the receiver's address is in the received call information and received frame judging means for determining whether the immediately following frame is one of the own frames.

4. A radio selective-calling receiver to which a signal is directed that has a series of frames that each contain call information, the receiver receiving frames selected from the series of frames that are directed to the receiver and that are named own frames, the receiver comprising:

informing means for indicating receipt of call information directed to the receiver in one of the own frames; and deferring means for deferring operation of said informing means until after receipt of a second one of the own frames that is separated from the own frame with the call information by one of the frames that is not one of the own frames.

5. The receiver of claim 4, wherein said deferring means defers operation of said informing means until immediately after receipt of the second own frame.

6. The receiver of claim 4, wherein said deferring means comprises address checking means for checking whether the receiver's address is in the received call information and received frame judging means for determining whether the immediately following frame is one of the own frames.

7. A method of operating a radio selective-calling receiver to which a signal is directed that has a series of frames that each contain call information, the receiver receiving frames selected from the series of frames that are directed to the receiver and that are named own frames, the method comprising the steps of:

indicating receipt of call information directed to the receiver in one of the own frames; and deferring the indicating step until after receipt of a frame immediately following the own frame with the call information when the immediately following frame is also one of the own frames.

8. A method of operating a radio selective-calling receiver to which a signal is directed that has a series of frames that each contain call information, the receiver receiving frames selected from the series of frames that are directed to the receiver and that are named own frames, the method comprising the steps of:

indicating receipt of call information directed to the receiver in one of the own frames; and deferring the indication step until after receipt of a second one of the own frames that is separated from the own frame with the call information by one of the frames that is not one of the own frames.

* * * * *